United States Patent
Morishita et al.

(10) Patent No.: US 10,181,556 B2
(45) Date of Patent: Jan. 15, 2019

(54) PIEZOELECTRIC/ELECTROSTRICTIVE MATERIAL, PIEZOELECTRIC/ELECTROSTRICTIVE BODY, AND RESONANCE DRIVING DEVICE

(71) Applicant: NGK INSULATORS, LTD., Nagoya (JP)

(72) Inventors: Akifumi Morishita, Komaki (JP); Tomohiko Hibino, Inazawa (JP)

(73) Assignee: NGK Insulators, Ltd., Nagoya (JP)

( * ) Notice: Subject to any disclaimer, the term of this patent is extended or adjusted under 35 U.S.C. 154(b) by 352 days.

(21) Appl. No.: 15/086,786

(22) Filed: Mar. 31, 2016

(65) Prior Publication Data

US 2016/0293832 A1   Oct. 6, 2016

(30) Foreign Application Priority Data

Mar. 31, 2015  (JP) ................. 2015-071565

(51) Int. Cl.
- *H01L 41/08* (2006.01)
- *H01L 41/187* (2006.01)

(Continued)

(52) U.S. Cl.
CPC .......... *H01L 41/1876* (2013.01); *B32B 18/00* (2013.01); *C04B 35/472* (2013.01); *C04B 35/493* (2013.01); *C04B 35/499* (2013.01); *C04B 35/62655* (2013.01); *C04B 35/62675* (2013.01); *H01L 41/43* (2013.01); *C04B 2235/3232* (2013.01); *C04B 2235/3244* (2013.01); *C04B 2235/3251* (2013.01); *C04B 2235/3262* (2013.01); *C04B 2235/3279* (2013.01); *C04B 2235/3284* (2013.01); *C04B 2235/3296* (2013.01); *C04B 2235/442* (2013.01); *C04B 2235/449* (2013.01); *C04B 2235/604* (2013.01); *C04B 2235/6021* (2013.01); *C04B 2235/6023* (2013.01);

(Continued)

(58) Field of Classification Search
CPC ............................. H01L 41/083; H01L 41/07
See application file for complete search history.

(56) References Cited

U.S. PATENT DOCUMENTS

| | | | | |
|---|---|---|---|---|
| 6,118,209 A * | 9/2000 | Okuyama | ............ | C04B 35/493 252/62.9 R |
| 8,871,111 B2 * | 10/2014 | Hibino | ................ | C04B 35/491 252/62.9 PZ |

(Continued)

FOREIGN PATENT DOCUMENTS

| JP | 2003-238248 A1 | 8/2003 |
|---|---|---|
| JP | 2006-001109 A1 | 1/2006 |

(Continued)

*Primary Examiner* — Thomas Dougherty
*Assistant Examiner* — Karen B Addison
(74) *Attorney, Agent, or Firm* — Burr & Brown, PLLC

(57) ABSTRACT

A piezoelectric/electrostrictive material is composed of Mn and a compound of $Pb(Zn, Nb)O_3$—$Pb(Ni, Nb)O_3$—$Pb(Zr, Ti)O_3$. A ratio of a molar amount of Mn relative to a sum of respective molar amounts of Ni, Zn, Ti, Zr, Nb and Mn is at least 0.001 to no more than 0.015. A ratio of a molar amount of Nb relative to a sum of respective molar amounts of Ni and Zn is at least 2.007 to no more than 2.125.

15 Claims, 2 Drawing Sheets

(51) Int. Cl.
  *C04B 35/472* (2006.01)
  *H01L 41/43* (2013.01)
  *B32B 18/00* (2006.01)
  *C04B 35/493* (2006.01)
  *C04B 35/499* (2006.01)
  *C04B 35/626* (2006.01)

(52) U.S. Cl.
  CPC ............... *C04B 2235/6025* (2013.01); *C04B 2237/346* (2013.01); *C04B 2237/348* (2013.01)

(56) References Cited

U.S. PATENT DOCUMENTS

| | | |
|---|---|---|
| 2011/0163634 A1 | 7/2011 | Kim et al. |
| 2013/0162415 A1 | 6/2013 | Kim et al. |

FOREIGN PATENT DOCUMENTS

| | | |
|---|---|---|
| JP | 2011-136322 A1 | 7/2011 |
| JP | 2013-134776 A1 | 7/2013 |

\* cited by examiner

PIEZOELECTRIC/ELECTROSTRICTIVE MATERIAL, PIEZOELECTRIC/ELECTROSTRICTIVE BODY, AND RESONANCE DRIVING DEVICE

CROSS-REFERENCE TO RELATED APPLICATIONS

This application claims priority under 35 U.S.C. § 119 to Japanese Patent Application No. 2015-071565, filed on Mar. 31, 2015. The entire disclosure of Japanese Patent Application No. 2015-071565 is hereby incorporated herein by reference.

BACKGROUND

Technical Field

The present invention relates to a piezoelectric/electrostrictive material, piezoelectric/electrostrictive body, and resonance driving device.

Background Art

Typically, a piezoelectric/electrostrictive material having a principal component of Pb(Zr, Ti) $O_3$ has been widely used.

Furthermore a piezoelectric/electrostrictive material has been proposed in the configuration of a Pb(Zn, Nb)$O_3$—Pb(Ni, Nb)$O_3$—Pb(Zr, Ti)$O_3$ solid solution for the purpose of enhancing a piezoelectric constant $d_{31}$ or reducing a sintering temperature (for example, reference is made to Japanese Patent Application Laid-Open No. 2006/001109 and Japanese Patent Application Laid-Open No. 2003-238248)

SUMMARY

However, it has not been possible to realize a piezoelectric/electrostrictive material that enhances a mechanical quality factor Qm and a piezoelectric constant $d_{31}$ in addition to enabling low temperature sintering.

In light of the circumstances described above, the object of the present invention is to provide a piezoelectric/electrostrictive material, piezoelectric/electrostrictive body, and resonance driving device that enhance a mechanical quality factor Qm and a piezoelectric constant $d_{31}$ in addition to enabling low temperature sintering.

A piezoelectric/electrostrictive material according to the present invention is composed of Mn and a compound of Pb(Zn, Nb)$O_3$—Pb(Ni, Nb)$O_3$—Pb(Zr, Ti)$O_3$. A ratio of a molar amount of Mn relative to a sum of respective molar amounts of Ni, Zn, Ti, Zr, Nb and Mn is at least 0.001 to no more than 0.015. A ratio of a molar amount of Nb relative to a sum of respective molar amounts of Ni and Zn is at least 2.007 to no more than 2.125.

The present invention provides a piezoelectric/electrostrictive material, piezoelectric/electrostrictive body, and resonance driving device that enhance a mechanical quality factor Qm and a piezoelectric constant $d_{31}$ in addition to enabling low temperature sintering.

DETAILED DESCRIPTION OF EMBODIMENTS

Figure 1:
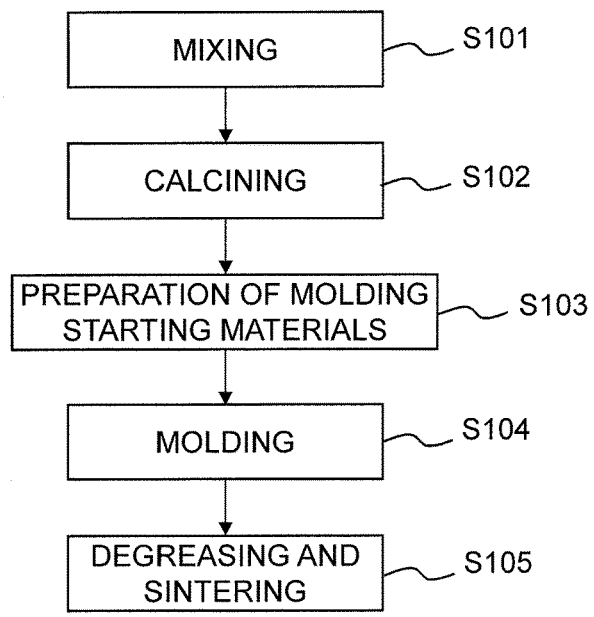
FIG. 1 is a flowchart illustrating a method of manufacturing of a piezoelectric/electrostrictive body.

The embodiments of the present invention will be described below making reference to the drawings. The same or similar portions disclosed in the following figures are denoted by the same or similar reference numerals. However, the figures are merely schematic, and the ratios of the respective dimensions or the like may differ from the actual values.

Piezoelectric/Electrostrictive Material

The piezoelectric/electrostrictive material according to the present embodiments contains a principal component of a compound of Pb(Zn, Nb)$O_3$—Pb(Ni, Nb)$O_3$—Pb(Zr, Ti)$O_3$. In the present embodiment, the feature that a composition X "contains a principal component" of a substance Y means that composition X overall includes preferably at least 80 wt % of substance Y, and more preferably at least 90 wt % of substance Y.

The compound formed from Pb(Zn, Nb)$O_3$—Pb(Ni, Nb)$O_3$—Pb(Zr, Ti)$O_3$ is a solid solution of Pb(Zn, Nb)$O_3$ (lead zinc niobate), Pb(Ni, Nb)$O_3$ (lead nickel niobate), and Pb(Zr, Ti)$O_3$ (lead zirconate titanate). Pb(Zr, Ti)$O_3$ is a solid solution of PbZrO$_3$ (lead zirconate) and PbTiO$_3$ (lead titanate).

A compound of Pb(Zn, Nb)$O_3$—Pb(Ni, Nb)$O_3$—Pb(Zr, Ti)$O_3$ contains Pb at less than a stoichiometric ratio. Deposition of different phases of Ni or Zn during sintering that has the adverse effect of reducing piezoelectric properties can be suppressed by reducing the content of Pb to less than the stoichiometric ratio. As a result, the piezoelectric constant $d_{31}$ of the piezoelectric/electrostrictive body can be enhanced by sintering the piezoelectric/electrostrictive material.

The compound of Pb(Zn, Nb)$O_3$—Pb(Ni, Nb)$O_3$—Pb(Zr, Ti)$O_3$ contains Nb at greater than a stoichiometric ratio. More specifically, the ratio of the molar amount of Nb in the piezoelectric/electrostrictive body relative to the sum of the respective molar amounts of Ni and Zn is at least 2.007 to no more than 2.125. In other words, the atomic ratio of the amount of Nb atoms to the amount of Ni atoms and Zn atoms is at least 2.007 to no more than 2.125.

In this manner, deposition of different phases of Ni or Zn during sintering that has the adverse effect of reducing piezoelectric properties can be suppressed by inclusion of a content amount of Nb above the stoichiometric ratio. In addition, the formation of intragranular pores can be inhibited by atomization. As a result, the piezoelectric constant $d_{31}$ of the piezoelectric/electrostrictive body can be enhanced.

The piezoelectric/electrostrictive material includes a secondary component of Mn. The ratio of the molar amount of Mn relative to the sum of the respective molar amounts of Ni, Zn, Ti, Zr, Nb and Mn is at least 0.001 to no more than 0.015. In other words, the atomic ratio of the amount of Mn atoms to the amount of Ni atoms, Zn atoms, Ti atoms, Zr atoms, Nb atoms and Mn atoms is at least 0.001 to no more than 0.015. Mn may be configured as a solid solution having a main component of the compound of Pb(Zn, Nb)$O_3$—Pb(Ni, Nb)$O_3$—Pb(Zr, Ti)$O_3$.

The addition of Mn to the piezoelectric/electrostrictive material enhances the mechanical quality factor Qm.

The piezoelectric/electrostrictive material can be sintered at a low temperature of no more than 1100 degrees C. As a result, the Curie temperature Tc of the resulting piezoelectric/electrostrictive body can be increased sintering of the piezoelectric/electrostrictive material.

The piezoelectric/electrostrictive material may be expressed by the general formula of $Pb_x[(Zn_{1/3}, Nb_{2/3})_a (Ni_{1/3}, Nb_{2/3})_b (Ti_c, Zr_d) Mn_e Nb_f]O_3$.

The quantity "x" in the general formula satisfies the inequality $0.98 \leq x \leq 1.00$. When x is smaller than 1.00, deposition of different phases of Ni or Zn during sintering that has the adverse effect of reducing piezoelectric properties can be suppressed. As a result, the piezoelectric constant $d_{31}$ of the piezoelectric/electrostrictive body can be enhanced.

The quantity "a+b" in the general formula satisfies the inequality $0.2 \leq a \leq 0.3$. When a+b is at least 0.2 and no more than 0.3, the Curie temperature Tc of the piezoelectric/electrostrictive body can be configured to at least 300 degrees C.

The quantity "c" in the general formula satisfies the inequality $0.35 \leq c \leq 0.45$. The quantity "d" in the general formula satisfies the inequality $0.3 \leq d \leq 0.4$.

The quantity "e" in the general formula satisfies the inequality $0.001 \leq e \leq 0.015$. In this manner, the mechanical quality factor Qm of the piezoelectric/electrostrictive body can be configured to at least 150.

The quantity "f" in the general formula satisfies the inequality $0.002 \leq f \leq 0.025$. Furthermore, $(2a+2b+f)/(a+b)$ in the general formula satisfies the inequality $2.007 \leq (2a+2b+f)/(a+b) \leq 2.125$. In this manner, the piezoelectric constant $d_{31}$ can be configured to be at least 180 pm/V.

Method of Manufacturing Piezoelectric/Electrostrictive Body

A method of manufacturing a piezoelectric/electrostrictive body using the piezoelectric/electrostrictive material described above will be described. FIG. 1 is a flowchart illustrating a method of manufacturing of a piezoelectric/electrostrictive body.

Firstly, in a step S101, powders of the starting materials being constituent elements (Pb, Zr, Ti, Zn, Ni, Mn, Nb) are weighed and mixed to obtain a composition having a general formula of $Pb_x[(Zn_{1/3}, Nb_{2/3})_a (Ni_{1/3}, Nb_{2/3})_b (Ti_c, Zr_d) Mn_e Nb_f]O_3$ (wherein $0.98 \leq x \leq 1.00$, $0.2 \leq a+b \leq 0.3$, $0.35 \leq c \leq 0.45$, $0.3 \leq d \leq 0.4$, $0.001 \leq e \leq 0.015$, $0.002 \leq f \leq 0.025$, $2.007 \leq (2a+2b+f)/(a+b) \leq 2.125$. At that time, since it is the case that Pb vaporizes during the sintering step described below, it is preferred to perform weighing by taking into account the composition fluctuation during the sintering step. Furthermore, when mixing by use of a ball mill that uses a zirconia ball as a pulverizing medium, it is preferred to perform weighing by taking into account the additional mixture of Zr from the zirconia ball. The method of mixture may be either a wet method or a dry method.

Oxides or precursors are used as the starting materials. A precursor of an oxide is a carbonate, tartrate, oxalate, or the like. The oxide precursors may be finally changed into an oxide. For example, an oxide precursor may be changed into an oxide during the calcination step described below. Although the oxide is normally a simple oxide, a complex oxide such as columbite, or the like may be used.

Next in a step S102, the mixture of starting material powders is calcined. In this manner, the starting material powders react and calcined material powders are synthesized. The calcination temperature is preferably at least 800 degrees C. and no more than 950 degrees C. However there is no limitation in this regard.

The particle diameter and the specific surface area of the calcination materials may be adjusted by pulverization or classification. The particle diameter or the shape of a secondary particle of the calcination material powder may be adjusted by granulation processing (for example, spray drying). The powder of the calcination material may be also heat processed.

Next, in a step S103, the calcination material is used to prepare the starting materials for molding to a configuration (powder, slurry, paste or the like) adapted to the molding method. A binder is preferably mixed into the starting materials for molding.

Next in a step S104, a green body is formed by molding of the molding materials. The method of molding including use of a method such as pressure molding, tape molding, casting, extrusion molding, gel cast molding, or the like. When performing molding by use of tape molding, although a green sheet can be obtained as a green body, a green body in the shape of a substrate may be formed by lamination and adhesion of two or more layers of the green sheet.

Next, in a step S105, a piezoelectric/electrostrictive body is formed by degreasing and sintering of the green body. The degreasing and sintering may be continuously performed, or may be performed separately. The sintering temperature may be at least 1000 degrees C. and no more than 1150 degrees C. In particular, the compound expressed by the general formula $Pb_x[(Zn_{1/3}, Nb_{2/3})_a (Ni_{1/3}, Nb_{2/3})_b (Ti_c, Zr_d) Mn_e Nb_f]O_3$ may be sintered at a low temperature of no more than 1100 degrees C. The piezoelectric/electrostrictive body may be processed by cutting, grinding, polishing, or the like.

The composition of the piezoelectric/electrostrictive body formed in the above manner is basically the same as the piezoelectric/electrostrictive material. Therefore the piezoelectric/electrostrictive body contains Mn and a compound of $Pb(Zn, Nb)O_3$—$Pb(Ni, Nb)O_3$—$Pb(Zr, Ti)O_3$. The ratio of the molar amount of Mn relative to the sum of the respective molar amounts of Ni, Zn, Ti, Zr, Nb and Mn is at least 0.001 to no more than 0.015. The ratio of the molar amount of Nb relative to the sum of the respective molar amounts of Ni and Zn is at least 2.007 to no more than 2.125.

Method of Manufacturing Resonance Driving Device

Figure 2:
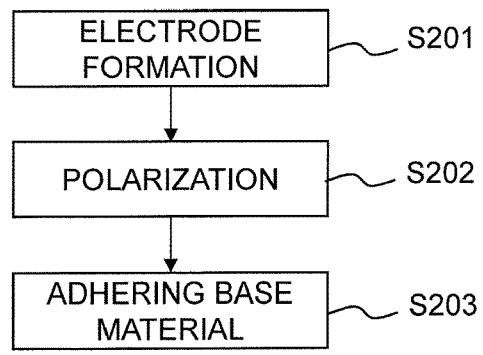
FIG. 2 is a flowchart illustrating a method of manufacturing of a resonance driving device.

The method of manufacturing a resonance driving device using the piezoelectric/electrostrictive body described above will be described. FIG. 2 is a flowchart illustrating a method of manufacturing of a resonance driving device.

Firstly, in a step S201, a pair of electrodes is mounted on the piezoelectric/electrostrictive body to thereby form a composite body of the pair of electrodes and the piezoelectric/electrostrictive body. The method of forming the electrode includes use of a method such as vapor deposition, sputtering, enameling, plating, or the like. The electrodes may include use of silver (Ag), copper (Cu), palladium (Pd), platinum (Pt), gold (Au), and aluminum (Al), or an alloy having a main component of those metals. However there is no limitation in this regard.

The pair of electrodes may be formed by co-sintering of two electrode films together with the green body of the piezoelectric/electrostrictive body in the sintering step (step S105 of FIG. 2) for the piezoelectric/electrostrictive body. The two electrode films may be configured as a pair of electrodes by co-sintering. At least one of the two electrode films may be embedded in the green body of the piezoelectric/electrostrictive material.

Next in a step S202, the composite body of the pair of electrodes and the piezoelectric/electrostrictive body is polarized to form a piezoelectric/electrostrictive device. The composite body of the pair of electrodes and the piezoelectric/electrostrictive body may be subjected to a processing operation such as an individualizing process after polarization.

Then in a step S203, a piezoelectric/electrostrictive device is formed by adhering a base material to the composite body of the pair of electrodes and the piezoelectric/electrostrictive body. The base material may be configured by a material that exhibits a predetermined elasticity. An adhesive agent (such as an epoxy resin or UV curing resin, or the like) may be used in order to adhere the base material.

The base material may be adhered by co-sintering the base material film together with the green body of the piezoelectric/electrostrictive material in the sintering step (step S105 of FIG. 2) for the piezoelectric/electrostrictive body. The base material film is configured as the base material by co-sintering.

A piezoelectric/electrostrictive device formed in the above manner includes a piezoelectric actuator, a piezoelectric filter, a piezoelectric vibrator, a piezoelectric transformer, a piezoelectric ultrasonic motor, a piezoelectric conditions for Samples No. 1 and 3 were sintering temperature 1075 degrees C. and sintering time 2 hours. The sintering conditions for Samples No. 2 and 4 were sintering temperature 1125 degrees C. and sintering time 2 hours. The sintering conditions for Samples No. 5 to 12 were sintering temperature 1075 degrees C. and sintering time 2 hours.

The mechanical quality factor Qm and a piezoelectric constant $d_{31}$ were measured by a resonance/anti-resonance method that uses an impedance analyzer. Furthermore, the dielectric constant was measured by raising the temperature of the piezoelectric/electrostrictive body at a rate of 1 degree C. per minute to a temperature of 600 degrees C. The temperature when the dielectric constant takes a maximum value was taken to be the Curie temperature. The measurement results are shown in Table 1.

TABLE 1

| Sample No | Pb x | PZN a | PNN b | PZN + PNN a + b | Excess Nb f | Ti c | Zr d | Mn e | (2a + 2b + f)/ (a + b) | $d_{31}$ (pm/V) | Qm | Tc (° C.) |
|---|---|---|---|---|---|---|---|---|---|---|---|---|
| 1 | 0.999 | 0.125 | 0.125 | 0.25 | 0.000 | 0.39 | 0.35 | 0.005 | 2.0000 | 155 | 275 | 300 |
| 2 | 0.985 | 0.125 | 0.125 | 0.25 | 0.035 | 0.37 | 0.35 | 0.005 | 2.1400 | 160 | 275 | 295 |
| 3 | 0.998 | 0.11 | 0.11 | 0.22 | 0.010 | 0.39 | 0.36 | 0.0005 | 2.0455 | 210 | 80 | 305 |
| 4 | 0.992 | 0.11 | 0.11 | 0.22 | 0.028 | 0.38 | 0.35 | 0.02 | 2.1273 | 150 | 800 | 290 |
| 5 | 0.998 | 0.11 | 0.11 | 0.22 | 0.010 | 0.40 | 0.37 | 0.004 | 2.0455 | 195 | 285 | 300 |
| 6 | 0.999 | 0.11 | 0.11 | 0.22 | 0.008 | 0.40 | 0.37 | 0.003 | 2.0364 | 225 | 160 | 305 |
| 7 | 0.998 | 0.11 | 0.11 | 0.22 | 0.009 | 0.40 | 0.37 | 0.0035 | 2.0409 | 215 | 200 | 300 |
| 8 | 0.998 | 0.125 | 0.125 | 0.25 | 0.012 | 0.38 | 0.35 | 0.005 | 2.0480 | 185 | 275 | 300 |
| 9 | 0.998 | 0.1 | 0.1 | 0.2 | 0.012 | 0.40 | 0.38 | 0.005 | 2.0600 | 180 | 280 | 315 |
| 10 | 0.998 | 0.14 | 0.14 | 0.28 | 0.005 | 0.39 | 0.33 | 0.003 | 2.0179 | 185 | 150 | 300 |
| 11 | 0.996 | 0.11 | 0.11 | 0.22 | 0.018 | 0.40 | 0.37 | 0.002 | 2.0818 | 220 | 150 | 300 |
| 12 | 0.998 | 0.11 | 0.11 | 0.22 | 0.01 | 0.41 | 0.36 | 0.009 | 2.0455 | 180 | 350 | 300 | gyrosensor, a knock sensor, a yaw rate sensor, an airbag sensor, a back sonar, a corner sonar, a piezoelectric buzzer, a piezoelectric speaker, and a piezoelectric ignition device, or the like.

In particular, the piezoelectric/electrostrictive body that is formed using the above piezoelectric/electrostrictive material is adapted for use in relation to a device that is driven at a resonance frequency. A device that is driven at a resonance frequency includes a piezoelectric actuator (for example, reference is made to Japanese Patent Application Laid-Open No. 2011-136322) or a haptic feedback device (for example, reference is made to Japanese Patent Application Laid-Open No. 2013-134776). However there is no limitation in this regard.

EXAMPLES

The examples of the present invention will be described below. However, the present invention is not limited to the examples described below.
Preparation of Sample No. 1 to No. 12

Firstly, a piezoelectric/electrostrictive material was prepared by weighing and mixing powders of the starting materials being constituent elements (Pb, Zr, Ti, Zn, Ni, Mn, Nb) to obtain a composition of $Pb_x[(Zn_{1/3}, Nb_{2/3})_a (Ni_{1/3}, Nb_{2/3})_b(Ti_c, Zr_d)Mn_eNb_f]O_3$ as shown in Table 1.

Next, the starting material powder mixture was calcined (900 degrees C., 2 hours).

Next, the calcined material was used to prepare a starting-material slurry for molding, and a green sheet is formed using a tape molding method.

Then, a piezoelectric/electrostrictive body was prepared by degreasing and sintering of the green sheet. The sintering The piezoelectric/electrostrictive material of Sample No. 5 to No. 12 satisfies $0.98 \leq x \leq 1.00$, $0.2 \leq a+b \leq 0.3$, $0.35 \leq c \leq 0.45$, $0.3 \leq d \leq 0.4$, $0.001 \leq e \leq 0.015$, $0.002 \leq f \leq 0.025$, $2.007 \leq (2a+2b+f)/(a+b) \leq 2.125$ in relation to the general formula $Pb_x[(Zn_{1/3}, Nb_{2/3})_a (Ni_{1/3}, Nb_{2/3})_b(Ti_c, Zr_d)Mn_eNb_f]O_3$ and can be sintered at the low temperature of 1075 degrees C. Furthermore, the piezoelectric/electrostrictive material of Sample No. 5 to No. 12 is imparted with a piezoelectric constant $d_{31}$ of at least 180 pm/V, a mechanical quality factor Qm of at least 150, and a Curie temperature Tc of at least 300 degrees C.

The piezoelectric/electrostrictive material and piezoelectric/electrostrictive body of Samples No. 5 to No. 12 exhibit a ratio of the molar amount of Mn relative to the sum of the respective molar amounts of Ni, Zn, Ti, Zr, Nb and Mn of at least 0.001 to no more than 0.015. The piezoelectric/electrostrictive material and piezoelectric/electrostrictive body of Samples No. 5 to No. 12 exhibit a ratio of the molar amount of Nb relative to the sum of the respective molar amounts of Ni and Zn is at least 2.007 to no more than 2.125.

On the other hand, Sample No. 1 has an insufficient content amount of Nb and therefore exhibits a reduced piezoelectric constant $d_{31}$. Sample No. 2 has an excessive high content amount of Nb and therefore exhibits a reduced piezoelectric constant $d_{31}$ and Curie temperature Tc. Sample No. 3 has an insufficient content amount of Mn and therefore exhibits a reduced mechanical quality factor Qm. Sample No. 4 has an excessive high content amount of Mn and therefore exhibits a reduced piezoelectric constant $d_{31}$ and Curie temperature Tc.

Figure 3:
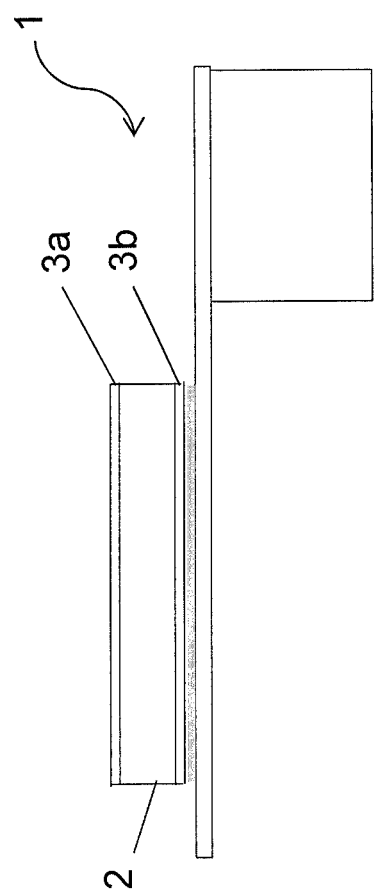
FIG. 3 shows a resonance driving device according to the invention.

FIG. 3 shows a resonance driving device 1 according to the invention, which includes a piezoelectric/electrostrictive body 2 and a pair of electrodes 3a and 3b.

What is claimed is:

1. A piezoelectric/electrostrictive material comprising Mn and a compound of $Pb(Zn, Nb)O_3$—$Pb(Ni, Nb)O_3$—$Pb(Zr, Ti)O_3$, wherein
   a ratio of a molar amount of Mn relative to a sum of respective molar amounts of Ni, Zn, Ti, Zr, Nb and Mn is at least 0.001 to no more than 0.015, and
   a ratio of a molar amount of Nb relative to a sum of respective molar amounts of Ni and Zn is at least 2.007 to no more than 2.125.

2. The piezoelectric/electrostrictive material according to claim 1 expressed by the general formula $Pb_x[(Zn_{1/3}, Nb_{2/3})_a (Ni_{1/3}, Nb_{2/3})_b (Ti_c, Zr_d) Mn_e Nb_f] O_3$ (wherein $0.98 \leq x \leq 1.00$, $0.2 \leq a+b \leq 0.3$, $0.35 \leq c \leq 0.45$, $0.3 \leq d \leq 0.4$, $0.001 \leq e \leq 0.015$, $0.002 \leq f \leq 0.025$, $2.007 \leq (2a+2b+f)/(a+b) \leq 2.125$).

3. The piezoelectric/electrostrictive material according to claim 2, wherein
   a sintering temperature is no more than 1100 degrees C.

4. The piezoelectric/electrostrictive material according to claim 1, wherein
   a sintering temperature is no more than 1100 degrees C.

5. A piezoelectric/electrostrictive body composed of a piezoelectric/electrostrictive material containing Mn and a compound of $Pb(Zn, Nb)O_3$—$Pb(Ni, Nb)O_3$—$Pb(Zr, Ti)O_3$, wherein
   a ratio of a molar amount of Mn relative to a sum of respective molar amounts of Ni, Zn, Ti, Zr, Nb and Mn is at least 0.001 to no more than 0.015, and
   a ratio of a molar amount of Nb relative to a sum of respective molar amounts of Ni and Zn is at least 2.007 to no more than 2.125.

6. The piezoelectric/electrostrictive body according to claim 5 wherein,
   a mechanical quality factor Qm is at least 150.

7. The piezoelectric/electrostrictive body according to claim 6, wherein
   a piezoelectric constant $d_{31}$ is at least 180 pm/V.

8. The piezoelectric/electrostrictive body according to claim 6, wherein
   a Curie temperature is at least 300 degrees C.

9. A resonance driving device comprising;
   the piezoelectric/electrostrictive body according to claim 6, and
   a pair of electrodes connected to the piezoelectric/electrostrictive body.

10. The piezoelectric/electrostrictive body according to claim 5, wherein
    a piezoelectric constant $d_{31}$ is at least 180 pm/V.

11. The piezoelectric/electrostrictive body according to claim 10, wherein
    a Curie temperature is at least 300 degrees C.

12. The piezoelectric/electrostrictive body according to claim 5, wherein
    a Curie temperature is at least 300 degrees C.

13. A resonance driving device comprising;
    the piezoelectric/electrostrictive body according to claim 12, and
    a pair of electrodes connected to the piezoelectric/electrostrictive body.

14. A resonance driving device comprising;
    the piezoelectric/electrostrictive body according to claim 10, and
    a pair of electrodes connected to the piezoelectric/electrostrictive body.

15. A resonance driving device comprising;
    the piezoelectric/electrostrictive body according to claim 5, and
    a pair of electrodes connected to the piezoelectric/electrostrictive body.

* * * * *